(12) United States Patent
Chen et al.

(10) Patent No.: US 10,412,851 B2
(45) Date of Patent: Sep. 10, 2019

(54) INCLINED STORAGE ARRAY FOR IMPROVED COOLING

(71) Applicant: QUANTA COMPUTER INC., Taoyuan (TW)

(72) Inventors: Chao-Jung Chen, Taoyuan (TW); Yu-Nien Huang, Taoyuan (TW); Ching-Yu Chen, Taoyuan (TW); Chih-Wei Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/440,999

(22) Filed: Feb. 23, 2017

(65) Prior Publication Data
US 2018/0242471 A1  Aug. 23, 2018

(51) Int. Cl.
*H05K 7/14* (2006.01)
*H05K 7/20* (2006.01)
(Continued)

(52) U.S. Cl.
CPC ......... *H05K 7/1489* (2013.01); *G11B 33/128* (2013.01); *G11B 33/142* (2013.01); *H05K 7/20172* (2013.01); *H05K 7/20727* (2013.01)

(58) Field of Classification Search
CPC .. H05K 7/14; H05K 7/20727; H05K 7/20736; H05K 7/20772; H05K 7/20781; H05K 7/20809; H05K 7/20818; H05K 7/20836; H05K 7/20454; H05K 7/1489; H05K 7/20172; H05K 7/20709; H05K 7/1488; G06F 1/20; G06F 1/206; G06F 1/656; G06F 1/658; G06F 1/166; G06F 1/667
(Continued)

(56) References Cited

U.S. PATENT DOCUMENTS 5,497,288 A    3/1996  Otis et al.
7,319,586 B2 * 1/2008  Hall ...................... G11B 33/08
                                                  211/41.17
(Continued)

FOREIGN PATENT DOCUMENTS

JP    2000149541 A   5/2000
JP    2007517355 A   6/2007

OTHER PUBLICATIONS

TW Office Action for Application No. 106120764, dated Jul. 24, 2018, w/ First Office Action Summary.
(Continued)

*Primary Examiner* — Vivek K Shirsat
*Assistant Examiner* — Ryan L Faulkner
(74) *Attorney, Agent, or Firm* — Nixon Peabody LLP; Zhou Lu

(57) ABSTRACT

A chassis is provided to improve the airflow over a plurality of disk drives. The chassis includes a housing with a front portion and a rear portion connected by a base portion. The base portion includes a plurality of hard drive slots oriented in a plurality of rows along a leading edge of the base portion. The chassis also includes a fan module configured to pass air from the front position of the housing to the rear position of the house. The plurality of hard drive slots is oriented such that a first portion of the hard drive slots is inclined relative to the leading edge of the base portion.

11 Claims, 9 Drawing Sheets

(51) Int. Cl.
*G11B 33/12* (2006.01)
*G11B 33/14* (2006.01)

(58) Field of Classification Search
USPC .................................... 454/184; 312/223.2
See application file for complete search history.

(56) References Cited

U.S. PATENT DOCUMENTS

| | | |
|---|---|---|
| 9,474,190 B1 | 10/2016 | Beall et al. |
| 2009/0097204 A1 | 4/2009 | Byers |
| 2010/0077252 A1 | 3/2010 | Siewert et al. |
| 2010/0091458 A1 | 4/2010 | Mosier, Jr. et al. |
| 2012/0201001 A1 | 8/2012 | Aoki et al. |

OTHER PUBLICATIONS

TW Search Report for Application No. 106120764, mailed with First Office Action dated Jul. 24, 2018.
Extended European Search Report for EP Application No. 17186721.1, dated Mar. 7, 2018.
JP Office Action for Application No. 2017-222644, dated Jan. 15, 2019, w/ First Office Action Summary.

* cited by examiner

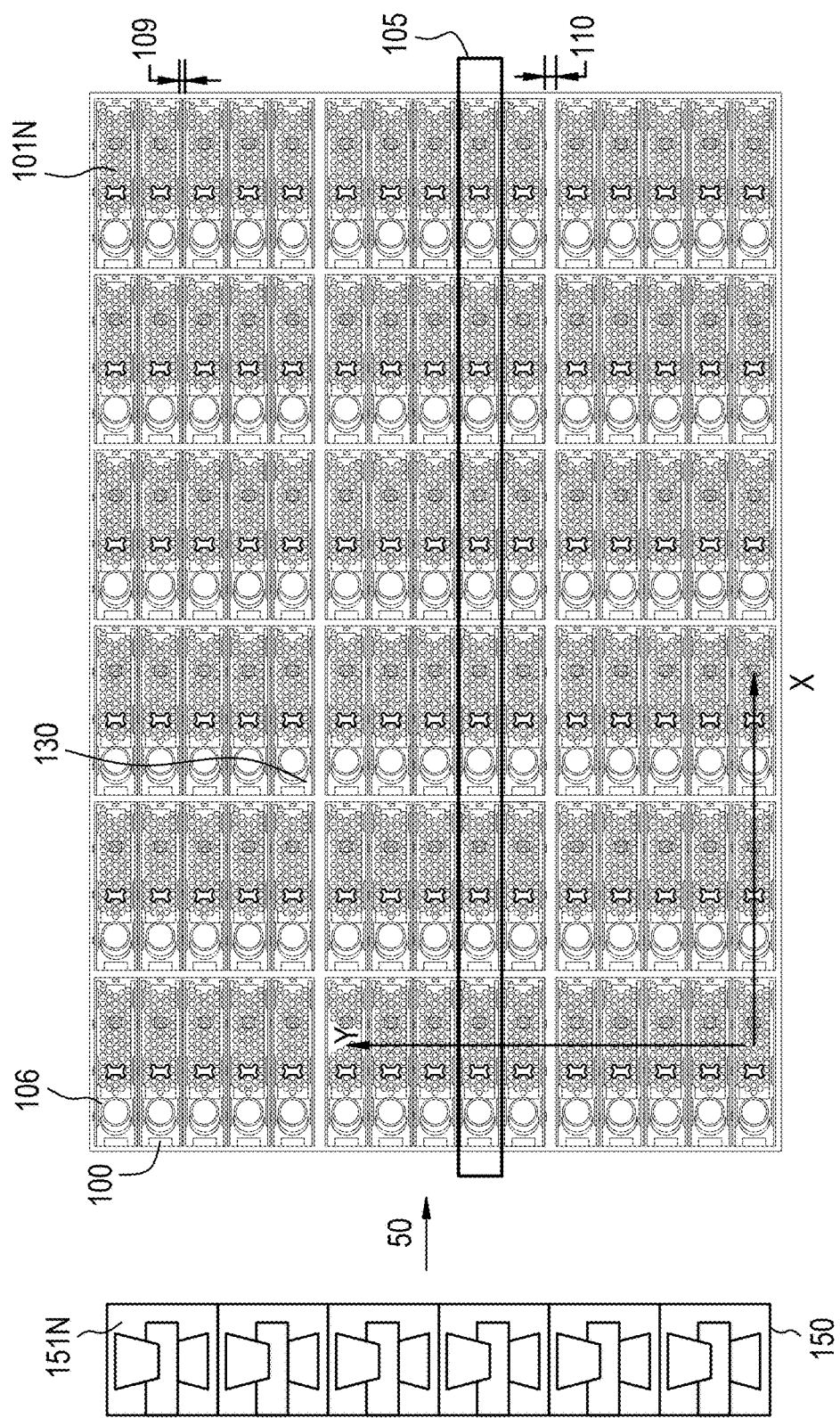

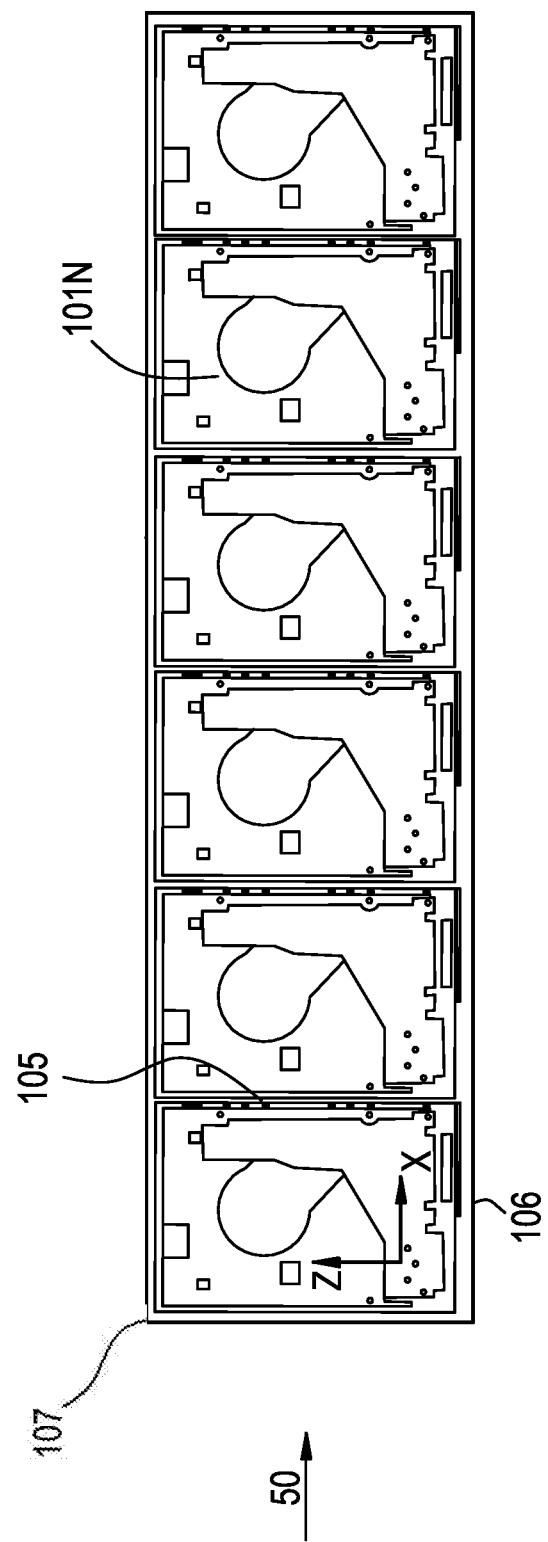

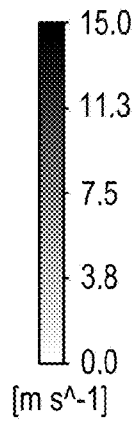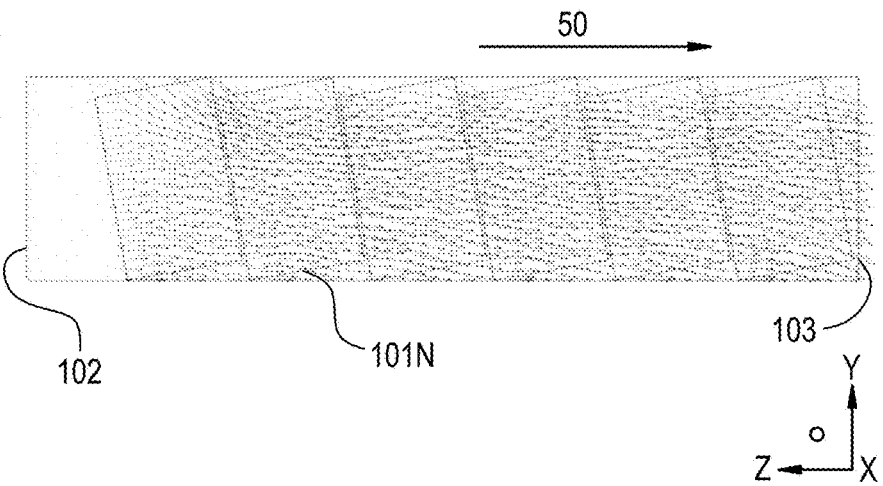
FIG. 6A
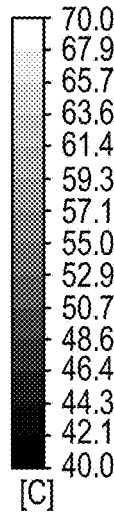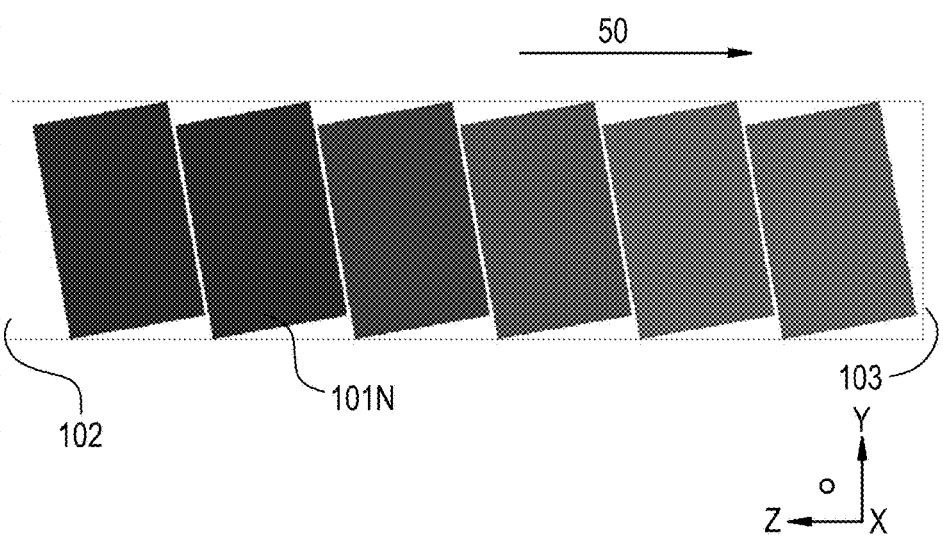
FIG. 6B

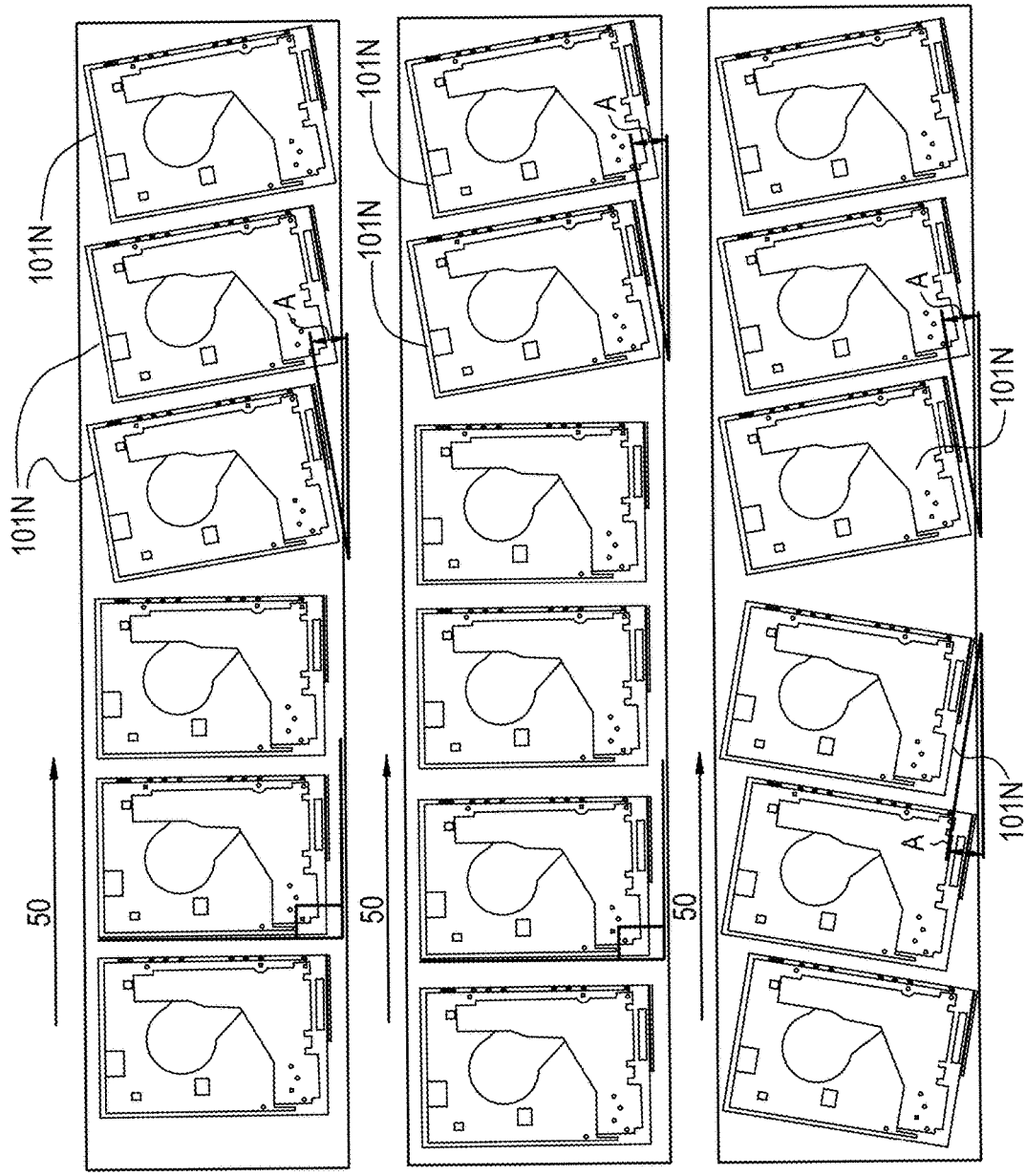

INCLINED STORAGE ARRAY FOR IMPROVED COOLING

FIELD OF THE INVENTION

The present invention relates to apparatuses for improving the thermal performance of a cooling system with respect to the storage array by increasing the surface area of the storage array.

BACKGROUND

Electronic devices such as disk drives are designed to operate within certain temperature ranges. However, when operating, devices such as disk drives may generate heat. If enough heat is generated to cause one of the disk drives to operate outside of its operational temperature range, problems may occur. For example, in some cases, increased temperature may cause a device to malfunction or behave erroneously. Sometimes, increased heat may even damage the electronic devices.

Historically, individual disk drives have not been particularly troublesome heat generating components. Most disk drives are adequately cooled using passive cooling techniques or by using one or more fans. Thus overheating problems rarely occur. As disk drives have become faster, however, their heat generation has increased. For example, as access speeds have increased, the spindle motors have become faster and more powerful. As a result, the spindle motors have also begun generating more heat. Thus, the cooling of individual disk drives is becoming much more of a concern than it has been in the past.

Another related cooling concern arises when multiple disk drives are placed close together within an enclosure. With rising data storage needs and decreasing storage media costs, more storage media such as disk drives may be included in enclosures. For example, a large number of disk drives may be set up as a RAID (Redundant Array of Inexpensive/Independent Disks) system. Alternately, a large number of disks may be arranged in a MOD (Just a Bunch Of Disks) configuration, which is any group of disks that are not set up in any specific RAID configuration. A common engineering goal is to achieve high-density packaging of disk drives in an enclosure so that the overall storage system takes up a minimal amount of space. However, this goal is often hindered by the need to cool the disk drives. In many cases, the probability of heat-related problems increases as disk drives are packaged more closely together. For example, the ability to transfer heat away from a hard disk drive may be reduced as the airflow over that disk drive is reduced.

When multiple disk drives are packaged closely together, the airflow over some of the disk drives may be blocked or constrained by the surrounding disk drives. Additionally, the combined heat generation from all of the disk drives may create a much hotter area than each disk drive would create individually. Thus, the disk drives in a high-density arrangement are more likely to be in a hotter environment due to the heat generation of neighboring drives. Furthermore, the airflow in a chassis may not be able to transfer as much heat away from the disk drives because neighboring drives may be blocking airflow for such drives. As a result, disk drives in a high-density arrangement are more likely to develop heat-related problems.

SUMMARY

Embodiments of the invention concern a chassis apparatus for improving the thermal performance of a cooling system with respect to the storage array by increasing the surface area of the storage array. An apparatus according to the various embodiments can include a housing with a front portion and a rear portion connected by a base portion. The base portion includes a plurality of hard drive slots oriented in a plurality of rows along a leading edge of the base portion. The plurality of hard drive slots is oriented such that a first portion of the hard drive slots is inclined relative to the leading edge of the base portion. The chassis also includes a fan module configured to pass air from the front position of the housing to the rear position of the house, over the inclined plurality of hard drive slots.

In some embodiments of the invention, the first portion of the hard drive slots is located at the rear portion of the housing. Furthermore, in some embodiments of the invention, the first portion of the hard drive slots comprises at least one row of the hard drive slots. In some embodiments, the first portion of the hard drive slots is inclined at 45 degrees relative to the leading edge of the base portion. In alternative embodiments, the first portion of the hard drive slots is inclined at 10 degrees relative to the leading edge of the base portion. In some embodiments, the first portion of the hard drive slots is inclined at no more than 45 degrees and no less than 10 degrees relative to the leading edge of the base portion.

In an exemplary embodiment of the apparatus, a second portion of the hard drive slots is inclined relative to the leading edge of the base portion in a mirrored orientation of the incline of the first portion of the hard drive slots. In some embodiments, the second portion of the hard drive slots is located at the front portion of the housing. In an exemplary embodiment of the apparatus, the second portion of the hard drive slots is inclined at 45 degrees relative to the leading edge of the base portion. In alternative embodiments, the second portion of the hard drive slots is inclined at 10 degrees relative to the leading edge of the base portion. In some embodiments, the second portion of the hard drive slots is inclined at no more than 45 degrees and no less than 10 degrees relative to the leading edge of the base portion.

BRIEF DESCRIPTION OF THE DRAWINGS

FIG. 1A is a top view of a system that includes storage array traditionally arranged in accordance to an embodiment;

FIG. 2 is a top view of the exemplary portion of the hard drive slots traditionally arranged in a storage array in accordance to an embodiment;

FIG. 6A shows the airflow velocity gradient of the exemplary portion of the hard drive slots arranged in a 10 degree incline in a storage array in accordance to an embodiment;

FIG. 6B shows the airflow temperature gradient of the exemplary portion of the hard drive slots arranged in a 10 degree incline in a storage array in accordance to an embodiment;

FIG. 8 is a top view of the exemplary portion of the hard drive slots arranged in a storage array in accordance to an embodiment;

FIG. 9 is a top view of the exemplary portion of the hard drive slots arranged in a storage array in accordance to an embodiment; and FIG. 10 is a top view of the exemplary portion of the hard drive slots arranged in a storage array in accordance to an embodiment.

DETAILED DESCRIPTION

Figure 1B:
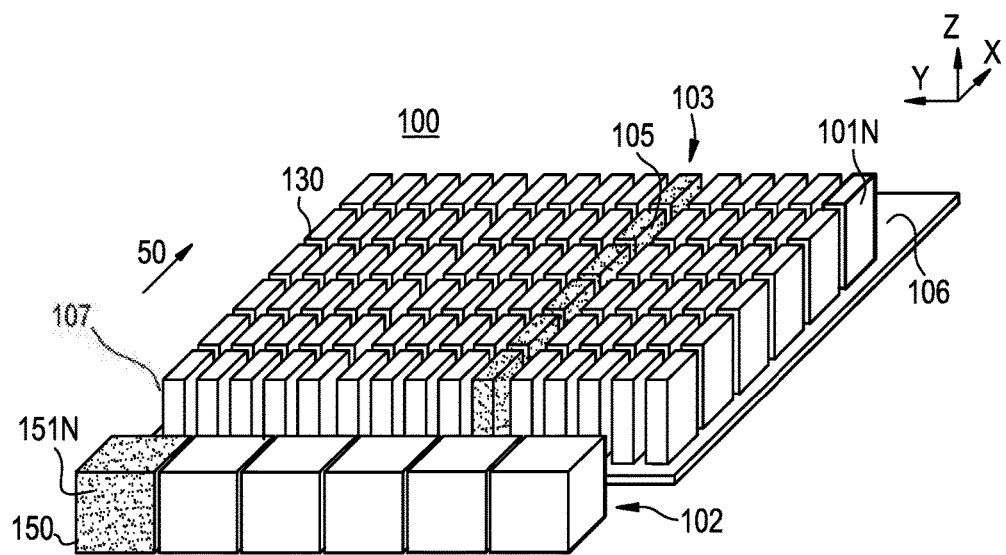
FIG. 1B is a side view of the exemplary portion of the hard drive slots traditionally arranged in a storage array in accordance to an embodiment.
Figure 3:
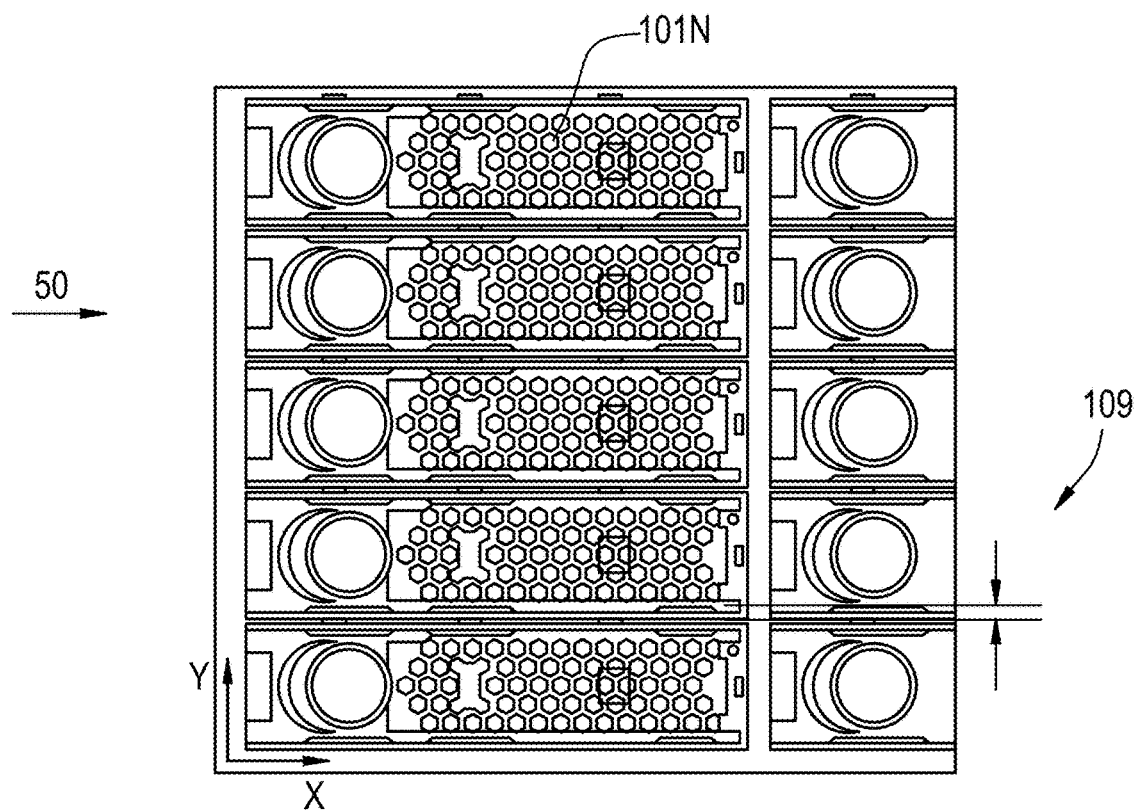
FIG. 3 is a top view of the exemplary portion of the storage array traditionally arranged in accordance to an embodiment.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In order to resolve the issue of heat dissipation in a plurality of disk drives in a high-density arrangement, preferred embodiments of the present invention provide a chassis apparatus for maximizing the surface area of the plurality of disk drives in a high-density arrangement. In this disclosure, the plurality of disk drives in a high-density arrangement are arranged in numerous configurations to expose the disk drives to more of the airflow than it would be exposed to in a conventional aligned arrangement.

FIGS. 1A and 1B are top views of a server device (e.g., chassis) 100 exemplifying a plurality of disk drives 101N in a conventional high-density arrangement. In some embodiments, the server device 100 includes a front end 102 and a rear end 103. The server device 100 can also include a base portion 106 configured to receive electronic components. The server device 100 can be configured such that it contains a storage array module 130, containing a plurality of storage arrays 105. In this configuration, the hard disk drive slots 101N are systematized in a high-density arrangement to maximize the number of hard disk drive slots 101N in the server device 100.

The airflow 50 can come across the server device 100 and the hard disk drive slots 101N from the front end 102 to the rear end 103 via a plurality of fan modules 150. It should be realized that the server device 100 may include other components not mentioned herein. The components mentioned above are only for example, and not to limit this disclosure. A person having ordinary knowledge in the art may flexibly include other components in accordance to the invention.

In some embodiments, the storage array module 130 is disposed in the server device 100 in base portion 106. To maximize storage, the storage array module 130 can include a plurality of storage arrays 105 closely stacked together. The space 110 between the plurality of storage arrays 105 is very small, to maximize the number of storage arrays 105. In FIG. 1, the storage array module 130 can include fifteen storage arrays 105 closely stacked together. Each of the storage arrays 105 contains a plurality of disk drives 101N. Furthermore, the plurality of storage arrays 105 can include a plurality of disk drives 101N closely stacked together. The space 109 between the disk drives 101N is very small, to maximize the number of disk drives 101N in the storage array 105. In some configurations the space 109 between the disk drives 101N is smaller than the space 110 between the storage arrays 105. The plurality of disk drives 101N can include hard disk drive, solid state disk drives, or a combination thereof. Furthermore, for the purpose of this invention, the plurality of disk drives 101N can include other drive technology not detailed herein. In FIGS. 1A and 1B, the plurality of disk drives 101N can include ninety hard disk drives. It should be realized that the quantities of the storage arrays (e.g., fifteen) and disk devices (e.g., ninety) mentioned above are only for example, and not to limit this disclosure. The person having ordinary knowledge in the art may flexibly select any proper quantity of storage arrays according to the requirement.

The plurality of fan modules 150 in the server device 100 is arranged in parallel. In an embodiment of the invention, the plurality of fan modules 150 is disposed near the storage array module 130 to cool the storage array module 130 via convection. The plurality of fan modules 150 is utilized to enhance the air convection across the server device 100 from the front end 102 to the rear end 103. The plurality of fan modules 150 can include six high-powered computer device fans 151N. Thus, the airflow 50 generated by the fans 151N flows into and out of the server device 100 along an x-axis though the plurality of disk drives 101N closely stacked together. Consequently, for efficiency, the airflow flowing along the x-axis in the present embodiment is increased to effectively cool between the nominal spaces 109, 110 between the plurality of plurality of disk drives 101N and storage arrays 105, respectively. This enables the plurality of fan modules 150 to maintain the storage array module 130 at the desired operating temperature. It should be realized that the quantities of the fans (e.g., six) mentioned above are only for example, and not to limit this disclosure. The person having ordinary knowledge in the art may flexibly select any proper quantity of fans in accordance with the disclosure.

Referring now to FIGS. 1A, 1B and 2, a storage array 105 is provided to exemplify the measured air speed in a traditional high-density arrangement. The air speed of the airflow 50, measured in meters per second (m/s), is one of the key parameters to reduce the heat dissipation from the storage arrays 105. The storage array 105 provides a plurality of disk drives 101N layered nearly exactly parallel to each other, with only a small amount of empty space 109 between the disk drives. Thus, in FIGS. 1A, 1B and 2, each of the disk drives is aligned with the other disk drives. In other words, each disk drive 101N is directly aligned with the disk drives in the same vertical plane as that disk drive. Given the rectangular shape of each disk drive, this aligned arrangement minimizes the amount of space consumed by the disk drives. Minimizing the space consumed by the drives may also enable the size of the enclosure that houses the disk drives to be minimized.

Because the disk drives 101N in FIGS. 1A, 1B and 2 are packaged so closely together, each drive must contend with both the heat it generates and the heat generated by its neighboring drives. In order to remove heat from the disk drives 101N, a plurality of fan modules 150 is provided. These cooling devices may be set up so that they move cooler air across the disk drives 101N, allowing the drives to transfer heat to the cooler air. The plurality of fan modules 150 then move the heated air away from the area surrounding the disk drives. However, the directly aligned arrangement of the disk drives may reduce the cooling efficiency of such a system.

The airflow 50 created by plurality of fan modules 150 follows the path of least resistance. As a result, the airflow 50 is primarily confined to flowing over and around the disk drives 101N at leading edges 107. Thus, the airflow between the disk drives 101N is limited. Consequentially, heat transfer away from some of the disk drives 101N, especially those in the middle of the storage array 105, may also be limited.

Figure 4A:
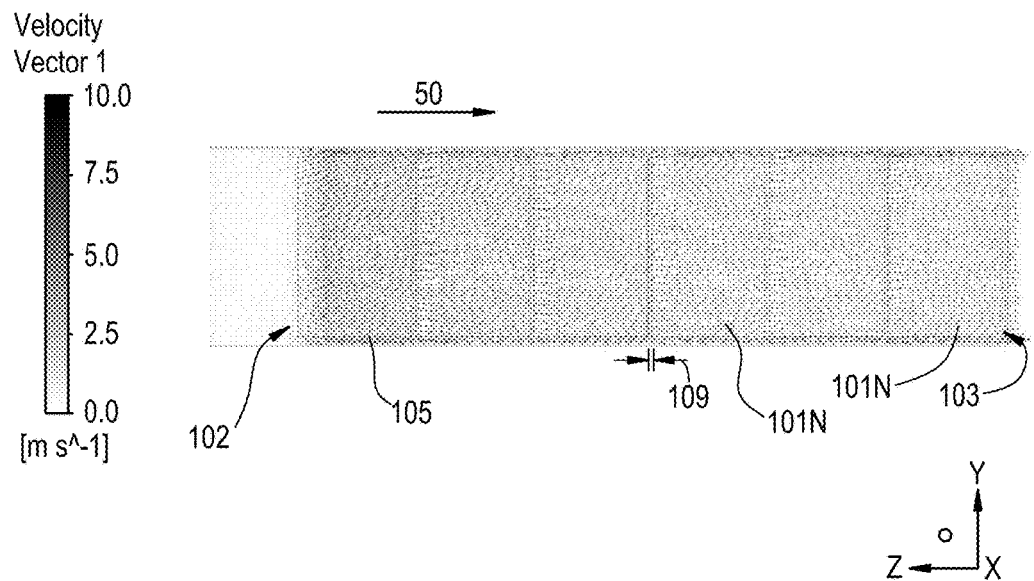
FIG. 4A shows the airflow velocity gradient of the exemplary portion of the hard drive slots traditionally arranged in a storage array in accordance to an embodiment.
Figure 4B:
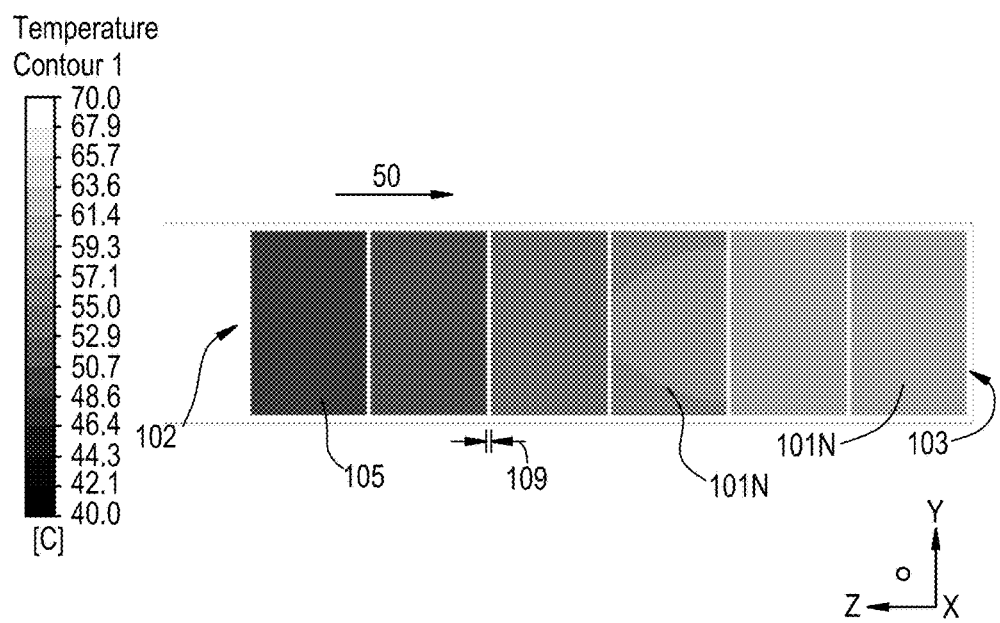
FIG. 4B shows the airflow temperature gradient of the exemplary portion of the hard drive slots traditionally arranged in a storage array in accordance to an embodiment.

Referring now to FIGS. 4A and 4B, because all of the disk drives 101N are aligned, some of the disk drives 101N are blocking airflow to other disk drives 101N. As a result, the blocked disk drives 101N located downwind are considerably hotter than the disk drives 101N receiving airflow. This is indicated in FIG. 4B. Additionally, the highest airflow occurs at just above and below the disk drives 101N. As a result, the configuration of the storage array 105 can result in there being very little airflow to cool the spaces 109 between the actual disk drives 101N. The reduced airflow resulting from the aligned arrangement may lead to less of the surface area of some of the disk drives 101N, especially the disk drives 101N in the middle, being cooled.

Figure 5:
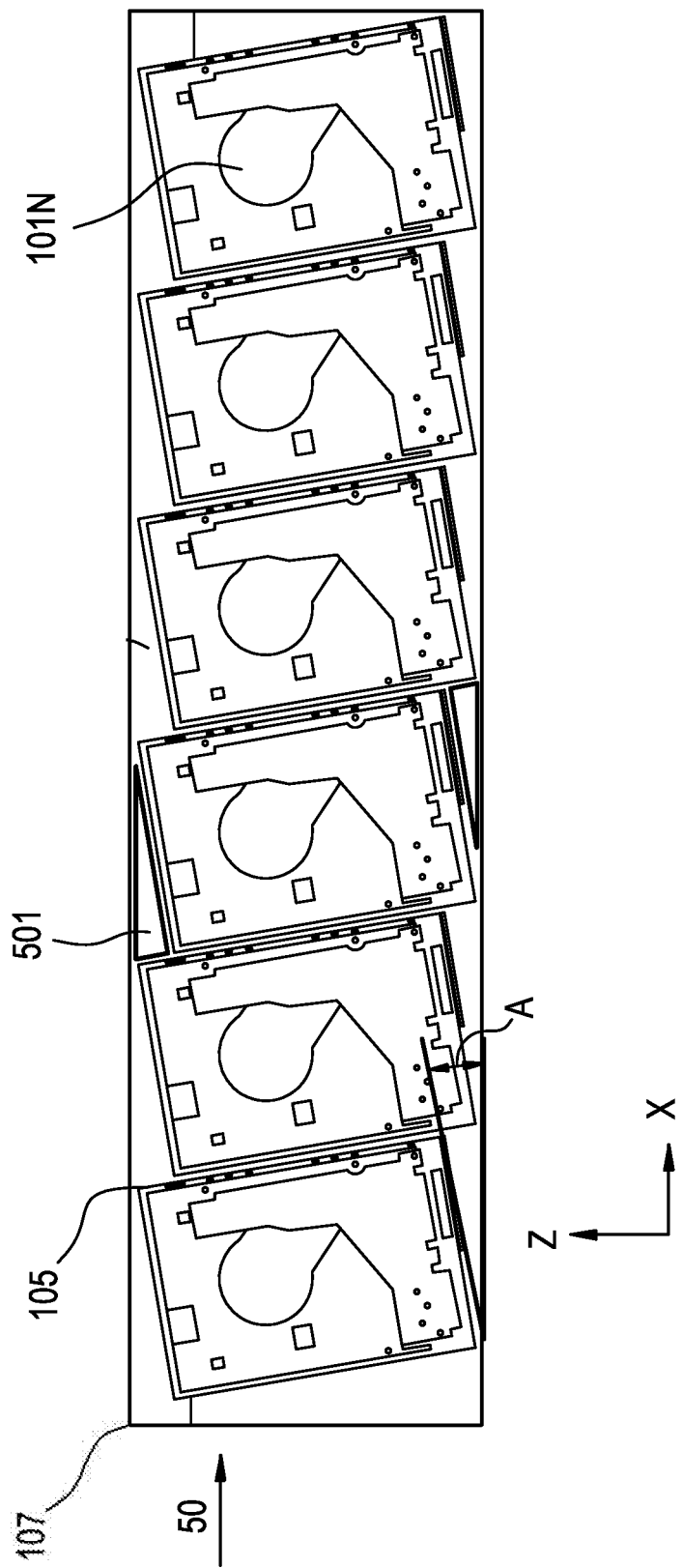
FIG. 5 shows an embodiment of an inclined arrangement of disk drives for improved airflow to the drives within the enclosure in accordance to an embodiment.
Figure 7A:
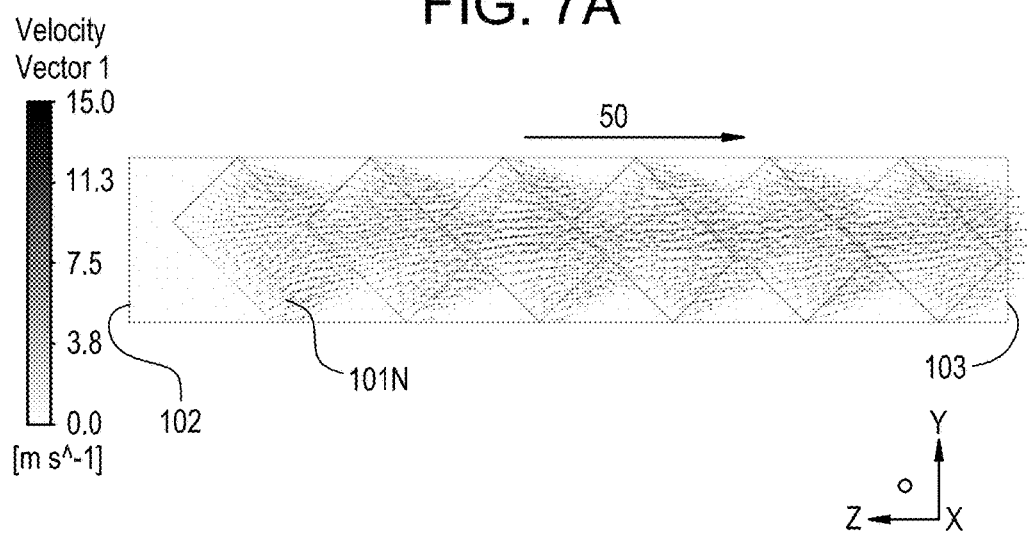
FIG. 7A shows the airflow velocity gradient of the exemplary portion of the hard drive slots arranged in a 45 degree incline in a storage array in accordance to an embodiment.
Figure 7B:
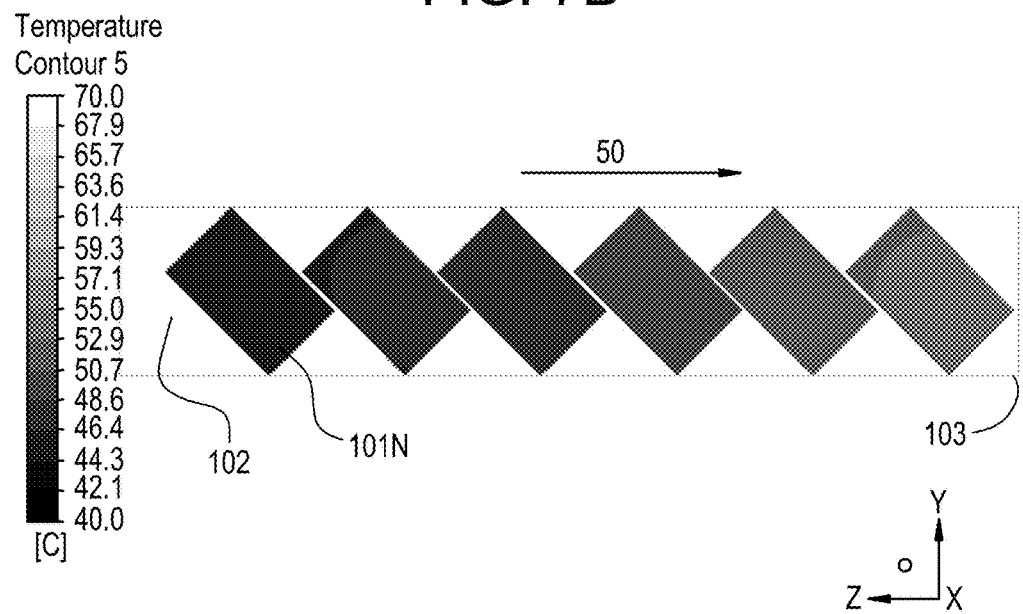
FIG. 7B shows the airflow temperature gradient of the exemplary portion of the hard drive slots arranged in a 45 degree incline in a storage array in accordance to an embodiment.

As FIGS. 1-4 illustrates, aligned configurations of disk drives 101N tend to reduce airflow to certain drives. In contrast, FIG. 5 shows one embodiment of an arrangement of disk drives 101N that are mounted within an enclosure and that allows better airflow to the drives 101N within the enclosure than the traditional arrangement does. In this embodiment, the disk drives 101N are arranged so that the disk drives 101N are inclined from with respect to the leading edge 107. The degree of incline (labeled A in FIG. 5) can be varied for optimal performance.

In this inclined arrangement, portions of the disk drives are now exposed to more of the airflow 50 than they would be in a traditional, directly aligned arrangement. For example, this configuration allows better airflow 50 between the disk drives 101N than would be allowed by an aligned configuration. In some embodiments, the offset may create an increased air gap 501 between the disk drives 101N and the leading edge 107 of the storage array 105. The air gap 501 is a tridimensional triangle that can create an air spoiler function. The air gap 501 can direct airflow vectors to go to the side surface of the disk drives 101N. As a result, higher airflow velocity is provided to remove heat from this large drive surface. This is discussed later in connection with FIGS. 6A-B and 7A-B. The air gap 501 is larger than a corresponding air gap in an aligned arrangement would be. As the size of the air gap 501 increases, more of the airflow may pass between the disk drives 101N.

The degree of incline chosen may vary between embodiments. For example, in one embodiment, the degree of incline may vary depending on the space constraints of the disk arrangement and the amount of cooling desired. For example, if constraints on the amount of space dominate the design process, the degree of inclination may be less than in a situation where cooling is the dominant concern.

In some embodiments, the minimum degree of incline desired is the degree of incline that increases the airflow between disk drives enough to provide a desired degree of cooling. In some embodiments, this minimum degree of incline is chosen to create a minimum air gap 501 that allows the desired degree of cooling. In some embodiments, the maximum degree of incline used can be an amount that allows a continuous air channel between disk drives 101N. Various other minimum or maximum degrees of incline may be desirable in other embodiments. Maintaining the degree of incline A between 10 degrees and 45 degrees allows for an efficient thermal solution while maximizing the number of disk drives 101N within the storage array 105.

Additionally, the inclination of the disk drives 101N is done in such a way that the accessibility of the disk drives 101N is only minimally or negligibly affected. Thus, the arrangement of disk drives 101N employs an inclined configuration while still being as accessible for connection, repair, hot swapping, and replacement as a traditional arrangement. In other embodiments, however, employing one of the novel configurations described herein can involve additionally modifying the enclosure in order to achieve a desired level of accessibility.

Referring to FIGS. 6A-B and 7A-B, the inclined arrangement can cause a larger portion of the airflow 50 to be diverted into a section of the storage array 105 configuration than would be in a traditional, aligned arrangement. As a result of the incline, more of the airflow is diverted between the disk drives 101N than would be if the drives were aligned. Therefore, each disk drive's surface area can be better cooled by the additional airflow between the disk drives 101N. As indicated in FIGS. 6A-B and 7A-B, the steeper the incline, the greater the air gap 501, and the more surface area is exposed. Thus, as more airflow is diverted between disk drives 101N, causing those drives to be exposed to a greater volume of airflow, the greater volume of airflow may remove more heat from the overall surface areas of those drives than would be removed in an aligned arrangement.

Thus, by inclining the disk drives 101N instead of employing a traditional configuration, airflow over the drives is improved. In general, an increase in airflow can describe various situations. For example, an increase in airflow can refer to a larger volume of air moving across a particular portion of a drive in an offset arrangement than in a traditional arrangement. Generally, an increase in airflow describes any situation in which the volume of air passing over a given portion of a disk drive during a certain time period is increased. Similarly, describing a disk drive or a portion of a disk drive as being exposed to more of airflow refers to that drive or portion of a drive experiencing an increased airflow. A result of exposing a disk drive (or portion of a disk drive) to an increased airflow can be that the disk drive is able to transfer more heat to the air passing over it, since more air is now passing over that disk drive than was passing over it before the airflow was increased.

Referring now to FIGS. 8, 9 and 10. In some embodiments, only a portion of the disk drives 101N in a layer may be inclined. For example, in one embodiment, only two disk drives 101N in a storage array 105 are inclined. In an alternative embodiment, three disk drives 101N in a storage array 105 are inclined. In some embodiments, the disk drives 101N are inclined in alternating directions and alternating degrees of incline A. For example, two disk drives 101N in a storage array 105 can be inclined in one direction, and the remaining two disk drives 101N can be inclined in a mirrored direction. Furthermore, two disk drives 101N in a storage array 105 can be inclined at 10 degrees while the remaining three disk drives 101N are inclined at 45 degrees. Varying the degree of incline and the direction of incline allows the user to create mixed airflow for downstream disk drives 101N. The number of disk drives to incline can depend on factors including but not limited to the spacing that would exist between the drives in an aligned arrangement, the number of storage arrays 105 in the storage array module 130, the heat generation of the drives, the placement of connections between and/or to the disk drives 101N, and the airflow that would exist between the drives in an aligned arrangement.

In some embodiments, the arrangement of disk drives 101N can also maintain a high disk drive density despite the disk drives 101N being inclined. For example, the configurations shown in FIGS. 8, 9 and 10 consume slightly more horizontal space than the traditional system shown in FIGS. 1, 2 and 3. Thus, airflow 50 between disk drives 101N can be better maintained by inclining the disk drives within an enclosure and, at the same time, such an arrangement may not require a large increase in packaging size. In some embodiments, the increased space consumption may be so slight that the inclined arrangement can fit in the same size enclosure as a corresponding (e.g., one with the same number of disk drives) aligned arrangement. For example, the inclined disk drive arrangement can be used in a standard rack- or cage-mounted system. In the embodiments discussed, the disk drives 101N are inclined with respect to the airflow 50. However, it should be noted that disk drives 101N can also be configured to be inclined in a perpendicular orientation with respect to airflow 50. A person having ordinary knowledge in the art may flexibly include other configurations of the disk drives 101N as it pertains to maximizing space while maximizing the surface area of the disk drives 101N.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A chassis, comprising:
   a base portion situated on a X-Y plane, the base portion comprising a plurality of hard drives oriented in a plurality of storage arrays along a leading edge of the base portion, the base portion comprising a front end and a rear end; and
   a fan module configured to pass air from the front end to the rear end,
   wherein the plurality of hard drives is tilted along a Z-axis that is perpendicular to the base portion, wherein the plurality of hard drives further comprises a first portion of the hard drives and a second portion of the hard drives, wherein the first portion and second portion are tilted at different angles.

2. The chassis of claim 1, wherein the first portion of the hard drives is located at the rear end.

3. The chassis of claim 2, wherein the second portion of the hard drives is inclined relative to the leading edge of the base portion in a mirrored orientation of the incline of the first portion of the plurality of hard drives.

4. The chassis of claim 3, wherein the second portion of the hard drives is located at the front end.

5. The chassis of claim 3, wherein the second portion of the hard drives is inclined at 45 degrees relative to the z-axis.

6. The chassis of claim 3, wherein the second portion of the hard drives is inclined at 10 degrees relative to the leading edge of the base portion.

7. The chassis of claim 3, wherein the second portion of the hard drives is inclined at no more than 45 degrees and no less than 10 degrees relative to the leading edge of the base portion.

8. The chassis of claim 1, wherein the first portion of the hard drives comprises at least one storage array of the plurality of hard drives.

9. The chassis of claim 1, wherein the first portion of the hard drives is inclined at 45 degrees relative to the leading edge of the base portion.

10. The chassis of claim 1, wherein the first portion of the hard drives is inclined at 10 degrees relative to the leading edge of the base portion.

11. The chassis of claim 1, wherein the first portion of the hard drives is inclined at no more than 45 degrees and no less than 10 degrees relative to the leading edge of the base portion.

* * * * *